United States Patent
Lee et al.

(10) Patent No.: US 8,916,274 B2
(45) Date of Patent: Dec. 23, 2014

(54) ORGANIC LIGHT EMITTING DEVICE

(75) Inventors: Eun-Jung Lee, Suwon-si (KR);
Ja-Hyun Im, Suwon-si (KR);
Tae-Kwang Sung, Suwon-si (KR);
Kwan-Hee Lee, Suwon-si (KR)

(73) Assignee: Samsung Display Co., Ltd.,
Giheung-Gu, Yongin, Gyeonggi-Do (KR)

(*) Notice: Subject to any disclaimer, the term of this patent is extended or adjusted under 35 U.S.C. 154(b) by 1890 days.

(21) Appl. No.: 12/145,080

(22) Filed: Jun. 24, 2008

(65) Prior Publication Data
US 2009/0096357 A1 Apr. 16, 2009

(30) Foreign Application Priority Data
Oct. 11, 2007 (KR) .......... 10-2007-0102578

(51) Int. Cl.
*H01L 51/54* (2006.01)
*H01L 51/50* (2006.01)
*H01L 51/00* (2006.01)

(52) U.S. Cl.
CPC ......... *H01L 51/5092* (2013.01); *H01L 51/0058* (2013.01); *Y10S 428/917* (2013.01)
USPC ........... 428/690; 428/917; 313/504; 313/505; 313/506; 257/40; 257/E51.05; 257/E51.026; 257/E51.032

(58) Field of Classification Search
USPC .................. 428/690, 917; 313/504, 505, 506; 257/13, 40
See application file for complete search history.

(56) References Cited

U.S. PATENT DOCUMENTS

| 7,229,704 | B2 | 6/2007 | Seki et al. |
| 2002/0045111 | A1 | 4/2002 | Machiguchi et al. |
| 2002/0106531 | A1* | 8/2002 | Naito ............... 428/690 |
| 2004/0032206 | A1 | 2/2004 | Weaver et al. |
| 2005/0014021 | A1 | 1/2005 | Seki et al. |
| 2005/0064235 | A1 | 3/2005 | Liao et al. |
| 2007/0020483 | A1 | 1/2007 | Park et al. |
| 2007/0029539 | A1* | 2/2007 | Yashima et al. ....... 257/13 |
| 2007/0054151 | A1* | 3/2007 | Iwakuma et al. ...... 428/690 |
| 2007/0057630 | A1 | 3/2007 | Nishita et al. |
| 2008/0111480 | A1* | 5/2008 | Lee et al. ............ 313/504 |

FOREIGN PATENT DOCUMENTS

| CN | 1845647 A | 10/2006 |
| CN | 1856888 A | 11/2006 |
| GB | 2 439 013 | 12/2007 |
| JP | 2002-14221 | 4/2002 |

(Continued)

OTHER PUBLICATIONS

Korean Office Action issued Dec. 22, 2008 by the Korean Intellectual Property Office.

(Continued)

*Primary Examiner* — Gregory Clark
(74) *Attorney, Agent, or Firm* — Robert E. Bushnell, Esq.

(57) ABSTRACT

An organic light emitting device that obtains stable image qualities through prevention of any significant decrease in brightness at high temperature. The organic light emitting device includes an anode; a cathode facing the anode; an organic emitting layer interposed between the anode and the cathode; an electron transport layer interposed between the organic emitting layer and the cathode and comprising an alkali metal compound or an alkali earth metal compound; and a buffer layer interposed between the organic emitting layer and the electron transport layer.

10 Claims, 2 Drawing Sheets

(56) References Cited

FOREIGN PATENT DOCUMENTS

| | | |
|---|---|---|
| JP | 2005-38819 | 2/2005 |
| JP | 2005-150078 | 6/2005 |
| JP | 2007-110102 | 4/2007 |
| JP | 2007-234248 | 9/2007 |
| KR | 2003-52028 | 6/2003 |
| KR | 2007-49080 | 5/2007 |
| KR | 2007-67987 | 6/2007 |
| WO | WO 2006/103909 | 10/2006 |

OTHER PUBLICATIONS

Extended European Search Report issued by the European Patent Office on Feb. 2, 2009.

Japanese Office Action dated Jul. 6, 2010, issued in corresponding Japanese Patent Application No. 2008-087700.

The Chinese Office Action issued by Chinese Patent Office on Aug. 3, 2011, corresponding to CN 200810132070.7 and Request for Entry attached herewith.

Chinese Office Action issues by Chinese Patent Office on Nov. 14, 2012 in the examination of the Chinese Patent Application No. 200810132070.7, which corresponds to Korean Patent Application No. 10-2007-0102578, and Request for Entry of the Accompanying Office Action attached herewith.

Chinese Office Action issued on Apr. 16, 2013 in connection with Chinese Patent Application No. 200810132070.7 which claims Korean Patent Application No. 10-2007-0102578 and Request for Entry of the Accompanying Office Action attached herewith.

Japanese Office Action issued by the JPO on Oct. 2, 2012 in the corresponding Japanese Patent Application No. 2008-087700.

Kanno et al. "Development of OLED with high stability and luminance efficiency by co-doping methods for full color displays." IEEE Journal of Selected Topics in Quantum Electronics, vol. 10, No. 1, pp. 30-36 (2004).

Grote et al. "Organic photonic materials and devices VIII." Proceedings of the SPIE, vol. 6117, pp. 185-193 (2006).

* cited by examiner

ORGANIC LIGHT EMITTING DEVICE

CROSS-REFERENCE TO RELATED APPLICATION

This application claims the benefit of Korean Patent Application No. 2007-102578, filed Oct. 11, 2007 in the Korean Intellectual Property Office, the disclosure of which is incorporated herein by reference.

BACKGROUND OF THE INVENTION

1. Field of the Invention

Aspects of the present invention relate to an organic light emitting device, and more particularly, to an organic light emitting device which obtains stable image qualities through prevention of any significant decrease in brightness.

2. Description of the Related Art

Recently, CRT devices have been replaced by thin and portable flat panel display devices, such as electroluminescent display devices. Electroluminescent display devices are self-emission display devices that have wide viewing angle, excellent contrast properties, and quick response speed. Because of these advantages, electroluminescent display devices are considered to be the next-generation display devices. Among electroluminescent display devices, organic light emitting devices including an organic emitting layer have higher brightness, lower operating voltage, and quicker response speed than inorganic light emitting devices. In addition, organic light emitting devices can produce a full range of colors.

On the other hand, organic light emitting devices deteriorate over time, and thus their light efficiency decreases. Furthermore, when organic light emitting devices are operated at high temperature, they tend to deteriorate more easily. Such deterioration occurs at normal temperature even after initial use. Therefore, long-term stable image qualities cannot be obtained. For example, AMOLED devices have a substantial decrease in green brightness or green efficiency at about 85° C., and thus the white color changes because of a decrease in green brightness and the white efficiency decreases because of a decrease in green efficiency.

SUMMARY OF THE INVENTION

Aspects of the present invention provide an organic light emitting device, and more particularly, an organic light emitting device that obtains stable image qualities through prevention of any significant decrease in brightness.

An aspect of the present invention provides an organic light emitting device including: an anode; a cathode facing the anode; an organic emitting layer interposed between the anode and the cathode; an electron transport layer including an alkali metal compound or an alkali earth metal compound interposed between the organic emitting layer and the cathode; and a buffer layer interposed between the organic emitting layer and the electron transport layer.

The electron transport layer includes at least one element selected from the group consisting of Li, Na, K, Rb, Be, Mg, Ca, Sr, Ba, Y, La, Sm, Gd, Yb, and Cs, or a compound thereof. More specifically, the electron transport layer includes at least one compound selected from the group consisting of cesium quinolate, potassium quinolate, rubidium quinolate, $CaF_2$, $BaF_2$, LiF, NaCl, CsF, $Li_2O$, and BaO. An electron injection layer is interposed between the electron transport layer and the cathode.

The organic light emitting device can further include a hole injection layer and a hole transport layer, which are disposed between the organic emitting layer and the anode. The organic emitting layer includes red, green, and blue organic emitting layers, and the buffer layer is interposed between at least one organic emitting layer of the red, green, and blue organic emitting layers and the electron transport layer.

The buffer layer can be interposed between the green organic emitting layer and the electron transport layer. The buffer layer includes at least one compound selected from the group consisting of $Alq_3$, CBP(4,4'-N,N'-dicarbazole-biphenyl), DSA(distyrylarylene), DPB, BAlq, and an anthracene derivative compound of Formula 1.

[Formula 1]

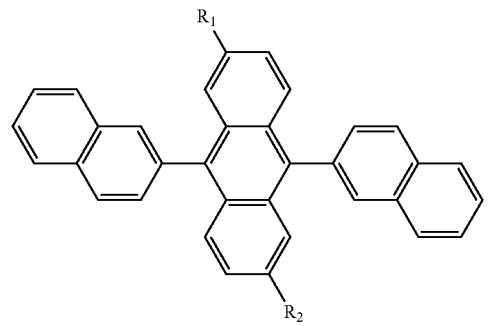

where R1 and R2 are each, independently, hydrogen, a substituted or unsubstituted C1-C30 alkyl group, a substituted or unsubstituted C1-C30 alkoxy group, a substituted or unsubstituted C6-C30 aryl group, a substituted or unsubstituted C6-C30 aryloxy group, a substituted or unsubstituted C4-C30 heteroaryl group, or a substituted or unsubstituted C6-C30 condensed multi-ring group, a hydroxy group, a halogen group, a cyano group, or a substituted or unsubstituted amino group.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
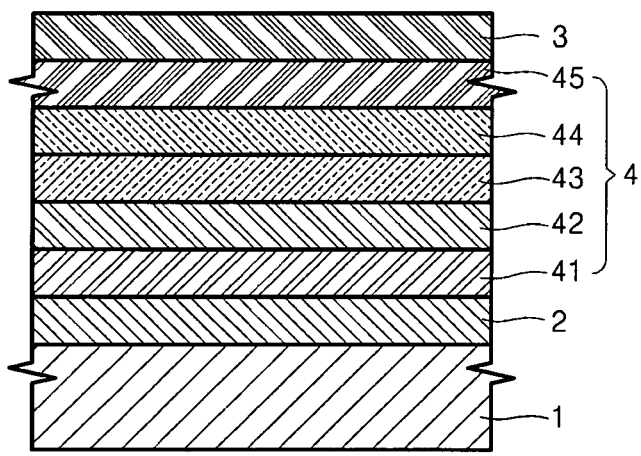
FIG. 1 is a sectional view of an organic light emitting device according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Moreover, it is to be understood that where is stated herein that one layer is "formed on" or "disposed on" a second layer, the first layer may be formed or disposed directly on the second layer or there may be an intervening layer between the first layer and the second layer. Further, as used herein, the term "formed on" is used with the same meaning as "located on" or "disposed on" and is not meant to be limiting regarding any particular fabrication process.

FIG. 1 is a sectional view of an organic light emitting device according to an embodiment of the present invention. The organic light emitting device of FIG. 1 includes; a substrate 1, an anode 2 and a cathode 3 facing each other on the substrate 1, and an organic layer 4 interposed between the anode 2 and the cathode 3, the organic layer 4 including an organic emitting layer 42.

The substrate 1 can be formed of a transparent glass material primarily consisting of $SiO_2$. Also, the substrate 1 can be formed of other materials such as a plastic material or a metal foil.

When an image is formed toward substrate 1 as in a bottom emission type organic light emitting device, the anode 2 can be a transparent-type electrode and the cathode 3 can be a reflective-type electrode. The anode 2 can be formed of a material having a high work function, such as ITO, IZO, ZnO, or $In_2O_3$. The cathode 3 can be formed of a material having a low work function, such as Ag, Mg, Al, Pt, Pd, Au, Ni, Nd, Ir, Cr; Li, or Ca.

When an image is formed toward the cathode 3 as in a top emission type organic light emitting device, the anode 2 can be a reflective-type electrode and the cathode 3 can be a transparent-type electrode. In this case, the anode 2, which is a reflective-type electrode, can be manufactured by forming a reflective layer using Ag, Mg, Al, Pt, Pd, Au, Ni, Nd, Ir, Cr, Li, Ca, or a compound thereof, and then forming a material having a high work function, such as ITO, IZO, ZnO, or $In_2O_3$ on the reflective layer. Also, the cathode 3, which is a transparent-type electrode, can be formed by depositing a metal having a low work function, such as Ag, Mg, Al, Pt, Pd, Au, Ni, Nd, Ir, Cr, Li, Ca, or a compound thereof, and then forming an assistant electrode layer or a bus electrode line using a transparent conductive material, such as ITO, IZO, ZnO, or $In_2O_3$ thereon. In the case of a two-directional emission type organic light emitting device, the anode 2 and the cathode 3 can be transparent-type electrodes.

The organic layer 4 is interposed between the anode 2 and the cathode 4. The organic layer 4 includes: the organic emitting layer 42 emitting visible light; and an electron transport layer 44 including an alkali metal or an alkali earth metal compound. An electron injection layer 45 is interposed between the electron transport layer 44 and the cathode 4.

The organic emitting layer 42 interposed between the anode 2 and the cathode 3 emits light through electrical operation of the anode 2 and the cathode 4. The organic emitting layer 42 can be formed of a low molecular weight or high molecular weight organic material. A hole injection and transport layer 41 can be formed between the organic emitting layer 42 and the anode 2 by depositing a hole injection layer and a hole transport layer. When required, another layer, such as an electrode blocking layer, can be further deposited between the organic emitting layer 42 and the anode 2.

The hole injection layer can be formed using an evaporation method, a spin coating method, or a casting method. The hole injection layer can be formed using various organic materials. A material for forming the hole injection layer can be: copper phthalocyanine (CuPc); a starburst-type amine, such as TCTA; m-MTDATA; IDE406 (produced by Idemitsu Co.); polyaniline/dodecylbenzenesulfonic acid (Pani/DBSA); or poly 3,4-ethylenedioxythiophene/poly 4-styrenesulfonate (PEDOT/PSS), but is not limited thereto.

Like the hole injection layer, the hole transport layer can be formed using an evaporation method, a spin coating method, or a casting method. The hole transport layer can be formed using various organic materials. A material for forming the hole transport layer can be 1,3,5-tricarbazolyl benzene, 4,4'-biscarbazolylbiphenyl, polyvinylcarbazole, m-biscarbazolylphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'diamine (TPD), N,N'-di(naphthalene-1-yl)-N,N'-diphenyl benzidine (α-NPD), N,N'-diphenyl-N,N'-bis(1-naphthyl)-(1,1'-biphenyl)-4,4'-diamine (NPB), poly 9,9-dioctylfluorene-co-N-4-butylphenyl diphenylamine (TFB), or poly 9,9-dioctylfluorene-co-bis-4-butylphenyl-bis-N,N-phenyl-1,4-phenylenediamine (PFB).

The organic emitting layer 42 can be formed using an evaporation method, a spin coating method, or a casting method. An available organic material can be copper phthalocyanine (CuPc), N,N'-di(naphthalene-1-yl)-N,N'-diphenyl-benzidine (NPB), or tris-8-hydroxyquinoline aluminum (Alq3).

The electron transport layer 44 can be formed using an evaporation method, a spin coating method, or a casting method. The electron transport layer 44 includes an alkali metal compound or an alkali earth metal compound. The alkali metal compound or alkali earth metal compound of the electron transport layer 44 can be an alkali metal compound or alkali earth metal compound of Li, Na, K, Rb, Be, Mg, Ca, Sr, Ba, Y, La, Sm, Gd, Yb, or Cs. For example, the alkali metal compound or alkali earth metal compound can be cesium quinolate, potassium quinolate, rubidium quinolate, $CaF_2$, $BaF_2$, LiF, NaCl, CsF, $Li_2O$, or BaO. When the electron transport layer 44 includes an alkali metal compound or an alkali earth metal compound, an organic light emitting device including the electron transport layer 44 has high efficiency, low operating voltage, and low power consumption. The alkali metal compound or alkali earth metal compound of the electron transport layer 44 may have a concentration of from 5 to 95 wt % based on the total weight of the electron transport layer 44.

The alkali metal compound or alkali earth metal compound is incorporated into the electron transport layer 44 through co-deposition or doping. The electron transport layer 44 including an alkali metal compound or an alkali earth metal compound allows easy injection of electrons in a direction from the cathode 3 to the organic emitting layer 42. As a result, an organic light emitting device including the electron transport layer 44 has high efficiency, low operating voltage, and low power consumption An electron injection layer 45 is formed on the electron transport layer 44 using an evaporation method, a spin coating method, or a casting method. A material for forming the electron injection layer 45 can be $BaF_2$, LiF, NaCl, CsF, $Li_2O$, BaO, or lithium quinolate, but is not limited thereto.

The organic layer 4 can be formed using a high molecular weight organic material. When the organic layer 4 is formed using a high molecular weight organic material, a hole transport layer can be formed using poly-(3,4)-ethylene-dihydroxy thiophene (PEDOT) or polyaniline (PANI) between the organic emitting layer 42 and the anode 2. Herein, the hole transport layer can be formed on the top surface of the anode 2 using an inkjet printing method or a spin coating method. The organic emitting layer 42 formed of a high molecular weight can be formed into a color pattern using PPV, soluble PPV's, cyano-PPV, or a polyfluorene, through inkjet printing, spin coating, or laser-using thermal transfer.

Furthermore, a buffer layer 43 can be interposed between the electron transport layer 44 and the organic emitting layer 42. The buffer layer 43 can be formed using Alq3, 4,4'-N,N'-dicarbazole-biphyenyl (CBP), distyrylarylene (DSA), DPB, BAlq, or an anthracene derivative compound represented by:

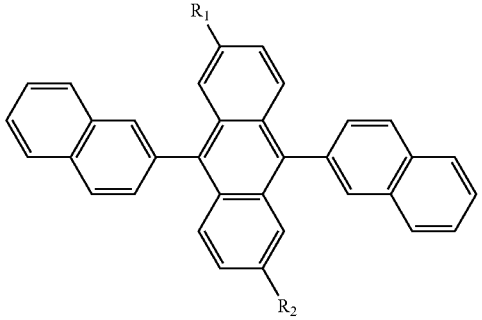

where R1 and R2 are each, independently, hydrogen, a substituted or unsubstituted C1-C30 alkyl group, a substituted or unsubstituted C1-C30 alkoxy group, a substituted or unsubstituted C6-C30 aryl group, a substituted or unsubstituted C6-C30 aryloxy group, a substituted or unsubstituted C4-C30 heteroaryl group, or a substituted or unsubstituted C6-C30 condensed multi-ring group, a hydroxy group, a halogen group, a cyano group, or a substituted or unsubstituted amino group. The buffer layer 43 may improve the reliability of an organic light emitting device at high temperature.

Without the buffer layer, the alkali metal or alkali earth metal, respectively, can separate from the alkali metal compound or alkali earth metal compound included in the electron transport layer 44 at high temperature and can migrate to the organic emitting layer 42. In this case, exciton quenching can occur in the organic emitting layer 42 and thus the efficiency of the organic light emitting device can decrease. However, when the buffer layer 43 is formed between the electron transport layer 44 including alkali metal or alkali earth metal and the organic emitting layer 42, the flow of the alkali metal or alkali earth metal toward the organic emitting layer 42 can be prevented such that the alkali metal and alkali earth metal can be kept separate from the organic emitting layer 42, and a decrease in efficiency can be prevented. Therefore, an organic light emitting device shows high reliability when operated at high temperature.

The buffer layer 43 can be formed to a thickness of from 10 Å to 500 Å. When the buffer layer 43 is less than 10 Å thick, high temperature reliability cannot be obtained. On the other hand, when the buffer layer 43 is more than 500 Å thick, the efficiency of the organic light emitting device may decrease.

The buffer layer 43 can be separately deposited on respective color pixels. That is, the buffer layer can be formed on a pixel that shows a decrease in brightness and efficiency when stored at high temperature.

Figure 2:
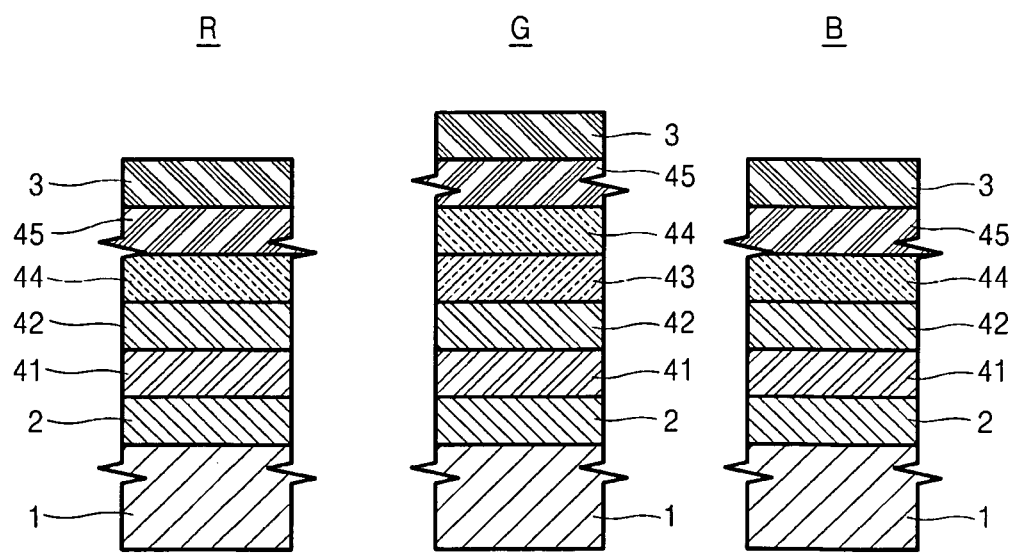
FIG. 2 is a sectional view of an organic light emitting device according to another embodiment of the present invention.

As illustrated in FIG. 2 for example, the buffer layer 43 is formed only on a green pixel (G) that shows a decrease in brightness and efficiency at high temperature. Even when the buffer layer 43 is formed only on a green pixel (G) that shows a decrease in brightness and efficiency at high temperature, any significant decrease in brightness of green and efficiency can be prevented and thus a change in white color and a decrease in white efficiency can also be prevented.

Figure 3:
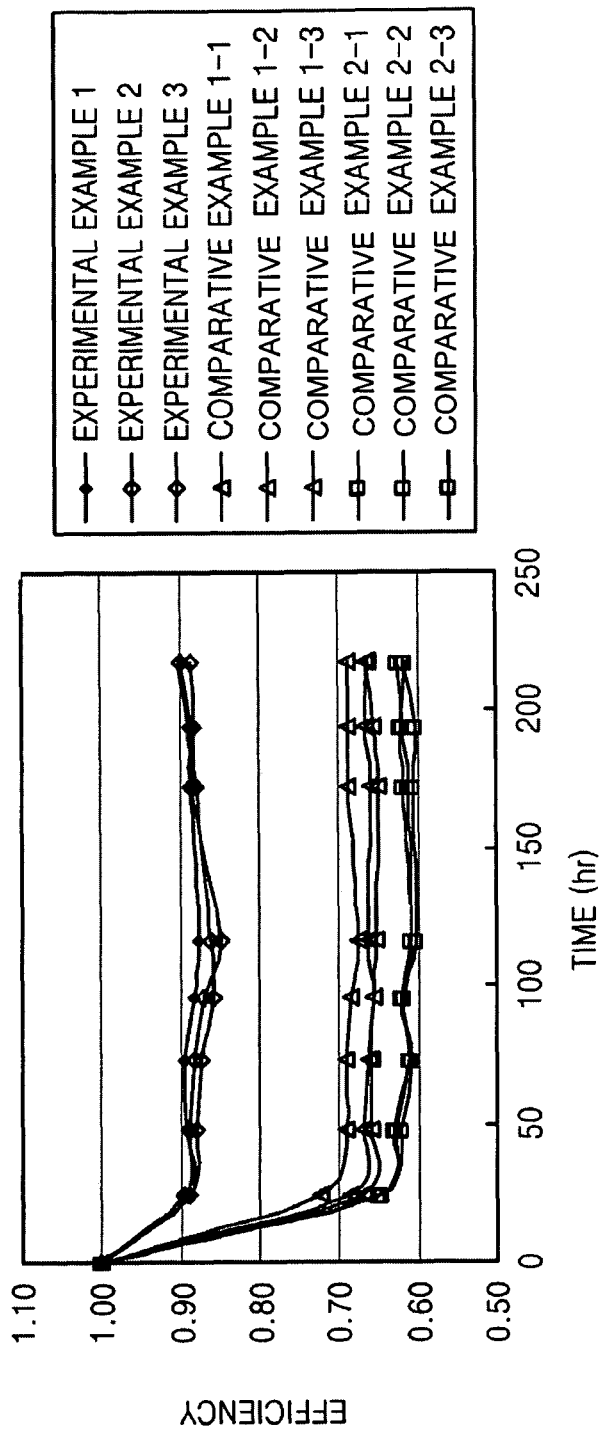
FIG. 3 is a graph showing effects of the present invention.

FIG. 3 is a graph of efficiency of a green pixel with respect to time when an organic light emitting device operates at high temperature (85° C.). In FIG. 3, Experimental Examples 1 through 3 use the structure according to an embodiment of the present invention. Specifically, Experimental Examples 1 through 3 refer to an organic light emitting device including a hole injection layer having a thickness of 750 Å, a hole transport layer having a thickness of 150 Å, a green emitting layer having a thickness of 300 Å, a buffer layer having a thickness of 50 Å, an electron transport layer including an alkali metal compound having a concentration of 50 wt % based on the total weight of the electron transport layer and a thickness of 100 Å, and an electron injection layer having a thickness of 10 Å.

Comparative Examples 1-1 through 1-3 refer to an organic light emitting device the same as in Experimental Examples 1 through 3 except that a buffer layer was not formed. Comparative Examples 2-1 through 2-3 refer to an organic light emitting device the same as in Comparative Examples 1-1 through 1-3 except that the concentration of the alkali metal compound included in the electron transport layer was 23 wt % based on the total weight of the electron transport layer.

As can be seen in FIG. 3, the decrease in efficiency was smaller when a buffer was used as described according to an embodiment of the present invention than when a buffer was not used and when the organic light emitting device was kept at a temperature of about 85° C. Therefore, in these embodiments, high-temperature reliability can be improved, and thus, when an organic light emitting display device is used at high temperature, a significant decrease in brightness can be prevented and image stability can be obtained.

Although a few embodiments of the present invention have been shown and described, it would be appreciated by those skilled in the art that changes may be made in these embodiments without departing from the principle and spirit of the invention, the scope of which is defined in the claims and their equivalents.

What is claimed is:

1. An organic light emitting device comprising:
    an anode;
    a cathode facing the anode;
    an organic emitting layer interposed between the anode and the cathode;
    an electron transport layer interposed between the organic emitting layer and the cathode, the electron transport layer comprising an alkali metal compound or an alkali earth metal compound; and
    a buffer layer interposed between the organic emitting layer and the electron transport layer.

2. The organic light emitting device of claim 1, wherein the alkali metal compound or alkali earth metal compound is selected from the group of elements consisting of Li, Na, K, Rb, Be, Mg, Ca, Sr, Ba, Y, La, Sm, Gd, Yb, and Cs.

3. The organic light emitting device of claim 1, wherein the alkali metal compound or alkali earth metal compound is selected from the group consisting of cesium quinolate, potassium quinolate, rubidium quinolate, $CaF_2$, $BaF_2$, LiF, NaCl, CsF, $Li_2O$, and BaO.

4. The organic light emitting device of claim 1, further comprising an electron injection layer interposed between the electron transport layer and the cathode.

5. The organic light emitting device of claim 1, further comprising a hole injection layer and a hole transport layer that are disposed as one layer between the organic emitting layer and the anode.

6. The organic light emitting device of claim 1, wherein the organic emitting layer further comprises red, green, and blue organic emitting layers, and the buffer layer is interposed between at least one organic emitting layer of the red, green, and blue organic emitting layers and the electron transport layer.

7. The organic light emitting device of claim 6, wherein the buffer layer is interposed between the green organic emitting layer and the electron transport layer.

8. The organic light emitting device of claim 1, wherein the buffer layer comprises at least one compound selected from the group consisting of Alq3, CBP (4,4'-N,N'-dicarbazole-biphenyl), DSA (distyrylarylene), DPB, BAlq, and an anthracene derivative compound of Formula 1,

[Formula 1]

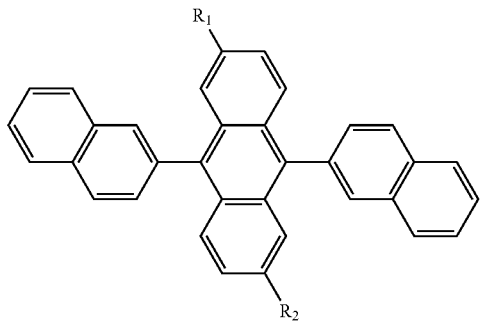

wherein R1 and R2 are each, independently, hydrogen, a substituted or unsubstituted C1-C30 alkyl group, a substituted or unsubstituted C1-C30 alkoxy group, a substituted or unsubstituted C6-C30 aryl group, a substituted or unsubstituted C6-C30 aryloxy group, a substituted or unsubstituted C4-C30 heteroaryl group, or a substituted or unsubstituted C6-C30 condensed multi-ring group, a hydroxy group, a halogen group, a cyano group, or a substituted or unsubstituted amino group.

9. The organic light emitting device of claim 1, wherein the buffer layer is from 10 Å through 500 Å thick.

10. The organic light emitting device of claim 1, wherein the organic emitting layer further comprising red, green, and blue organic emitting layers, and the buffer layer is interposed only between the green organic emitting layer and the electron transport layer.

* * * * *